Figure 2:
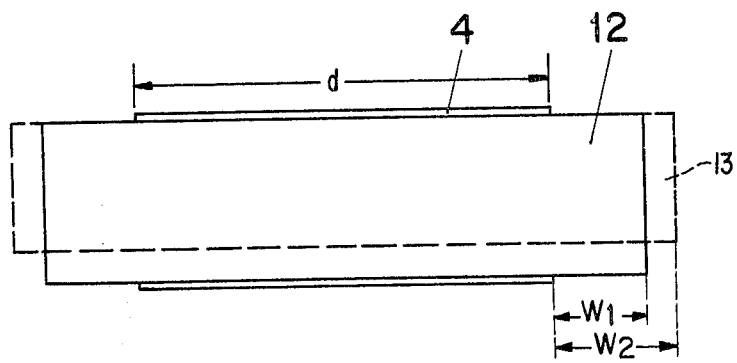

United States Patent [19]
Eisele

[11] 4,383,355
[45] May 17, 1983

[54] METHOD FOR THE PRODUCTION OF A SEALED HOUSING FOR A DISK SHAPED SEMICONDUCTOR BODY WHICH EXHIBITS AT LEAST ONE PN-TRANSITION

[75] Inventor: Dieter Eisele, Lampertheim, Fed. Rep. of Germany

[73] Assignee: BBC Brown, Boveri & Company, Limited, Baden, Switzerland

[21] Appl. No.: 198,101
[22] PCT Filed: May 18, 1979
[86] PCT No.: PCT/CH79/00070
  § 371 Date: Feb. 21, 1980
  § 102(e) Date: Feb. 21, 1980
[87] PCT Pub. No.: WO80/00640
  PCT Pub. Date: Apr. 3, 1980

[30] Foreign Application Priority Data
Sep. 7, 1978 [DE] Fed. Rep. of Germany ....... 2838997

[51] Int. Cl.³ .............................................. H01L 21/52
[52] U.S. Cl. ...................................... 29/588; 29/589; 357/79; 357/81
[58] Field of Search .................. 29/588, 589; 264/230; 357/79 (U.S. only), 81; 277/DIG. 6

[56] References Cited
U.S. PATENT DOCUMENTS

| | | | |
|---|---|---|---|
| 3,086,242 | 4/1963 | Cook et al. | 264/230 X |
| 3,243,211 | 3/1966 | Wetmore | 264/230 X |
| 3,297,819 | 1/1967 | Wetmore | 64/230 X |
| 3,443,168 | 5/1969 | Camp et al. | 357/79 |
| 3,654,529 | 4/1972 | Lord | 357/79 |
| 3,837,000 | 9/1974 | Platzoeder et al. | 29/588 X |
| 3,886,586 | 5/1975 | Bahlinger et al. | 357/79 |
| 4,126,758 | 11/1978 | Krumme | 29/588 X |

OTHER PUBLICATIONS

*Encyclopedia of Polymer Science and Technology* (1971), New York, John Wiley & Sons, vol. 14, pp. 600–617.

*Primary Examiner*—L. DeWayne Rutledge
*Assistant Examiner*—Alan E. Schiavelli
*Attorney, Agent, or Firm*—Oblon, Fisher, Spivak, McClelland & Maier

[57] ABSTRACT

The invention concerns a method for the construction of a sealed disc cell housing for a disc shaped semiconductor body (1), which consists, essentially, of a hollow-cylindrical insulation housing (9) and two pressure contact bodies (4). The latter are provided with seal rings (12) comprising tubing sections of a plastic material which has been treated by electron irradiation and is expandable by heating. The contact bodies (4) are inserted into the insulation housing (9) and the seal ring (12) heated, whereby the wall thickness of the tubing sections (12) increases seal the gap between the pressure contact bodies (4) and the insulation housing (9).

2 Claims, 3 Drawing Figures

METHOD FOR THE PRODUCTION OF A SEALED HOUSING FOR A DISK SHAPED SEMICONDUCTOR BODY WHICH EXHIBITS AT LEAST ONE PN-TRANSITION

The invention refers to a method for the production of a sealed housing for a disk-shaped semiconductor body exhibiting at least one pn-transition, which is capable of being pressure-contacted on each of its two main sides by way of electrode parts and a pressure contact body as housing enclosure, both thermally and electrically, whereby each pressure contact body is provided with an elastic seal ring. This seal ring is employed in an insulating housing of a hollow cylindrical shape which encloses the semiconductor body. It is intended for use for controllable power semiconductor elements. The housing has a pass-through for control electrode connection.

The process finds application in the production of disc cell housings for controllable and non-controllable power semiconductor elements, whereby, in special cases, it is also possible to insert two semiconductor bodies after interposition of appropriate metallic discs between the pressure contact bodies, into the insulation housing.

A housing with the previously described seal ring technique has already been proposed for a power semiconductor element (German Patent Application No. P 28 25 682.5) and U.S. patent application No. 192,511. In order to carry out the seal ring technique of the older proposal, the pressure contact bodies must be provided with a circumferential groove to accept the seal ring. Further, it is appropriate to polish the inside of the insulating housing from a ceramic material in order to assure appropriate sealing.

It is the task of the invention to save preparatory work in the production of the previously described housing in respect of sealing technique and yet to obtain a tight housing closure.

The solution of the task consists of the fact that, according to the invention:

(a) tubing sections of a resilient plastic material that has been treated by an electron irradiation treatment are used as seal rings, (b) the tubing sections are stretched onto the two pressure contact bodies and (c) the tubing sections are heated after their insertion into the insulating housing for purposes of relaxation, whereby they maintain mechanical coupling between said pressure contact bodies and the insulating housing and seal the housing under increase of their wall thickness.

Plastic tubing material which is treated by electron irradiation, is generally known and is obtainable in the marketplace, e.g. Viton tubing from Raychem, Great Britain or DuPont, U.S.A. Viton(trademark) is a synthetic caoutchouc (fluoro-caoutchouc), a copolymer from hexafluoro-propylene and vinylidene fluoride (Plastics Dictionary by Dr. K. Stoeckhert, 4th Edition (1967), pg. 375). The applicability of such tubing sections of such material, preferably of Viton, for the sealing of power semiconductor-disc cell housings, has so far not yet been recognized.

Advantageously, each tubing section can be stretched onto the corresponding pressure contact body without the requirement of a groove or a ring seat on its edge. After insertion into the insulating housing, heating suffices to obtain a good seal between the corresponding pressure contact body and the interior wall of the insulating housing which, preferably consists of a ceramic material; because the tubing section relaxes upon heating and gets to a greater wall thickness, presumably because of the splitting of the cross linking or crystallization nuclei of the internal structure that had been previously formed by the electron irradiation. Advantageously, a mechanical preparation of the interior wall of the insulation housing can be eliminated.

Figure 1:
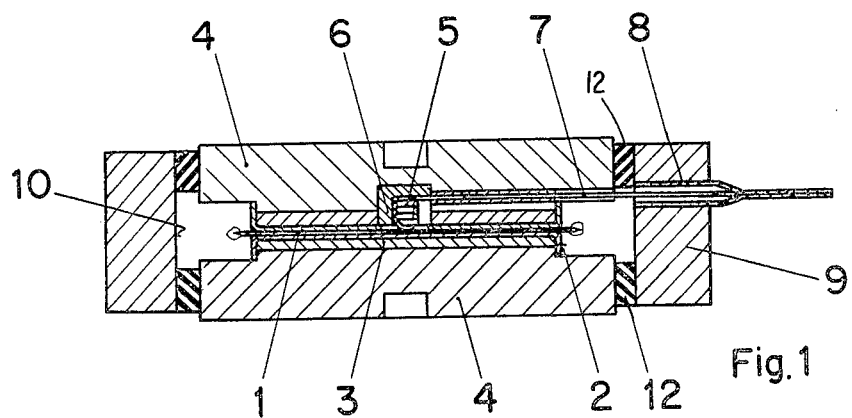

In the following, the invention is further explained on the basis of an exposition sample presented in a drawing. Shown are:

FIG. 1: A cross section of a controllable power transistor building element with housing.

FIG. 2: a pressure contact body with tubing section stretched on and

Figure 3:
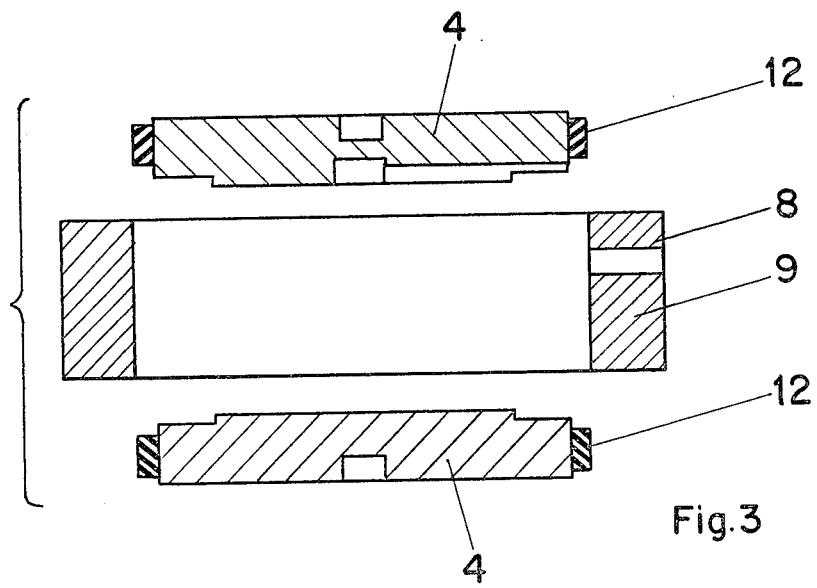

FIG. 3: the insertion of two pressure contact bodies with tubing section stretched-on into an insulating housing.

FIG. 1 shows a pressure contactable, controllable power transistor building element with housing and sealing technique. Starting from the disc-shaped semiconductor body 1, the following are connected in sequence to its main surfaces: a dish 2 of ductile silver, a metallic round body 3, preferably of molybdenum and a pressure contact body 4, preferably of copper. The upper main surface of the semiconductor body 1, above in the drawing, is directly pressure contacted within the range of its control zone by a spring 5. Spring 5 is insulated against the upper pressure contact body 4 by means of a shield 6. A control electrode connection 7 is insulated by means of an appropriated pass-through 8 of an insulation housing 9 of the so far described sandwich arrangement and, thus passes through the housing.

Between interior wall 10 of the insulating housing 9 and the edges of the pressure contact bodies 4, there are tubing sections 12 of resilient plastic, which are attached for the purpose of sealing, to the mentioned surfaces, as seal rings.

Each of the two tubing sections 12 is applied, prior to its insertion into insulating housing 9, onto its corresponding pressure contact body 4. The tubing section 12 that had been expanded in axial direction by electron irradiation, has a relatively thin wall thickness w1, e.g. of 1 mm. In FIG. 2, it is indicated by a dashed line under 13, that it is possible to attain, by means of the heating of the tubing section 12, a greater wall thickness w2, e.g. of 2 mm with the same inner diameter d. But, as was mentioned in the beginning, this heating only takes place after insertion into the insulating housing 9.

FIG. 3 shows the insertion of the pressure contact bodies, equipped with their tubing sections 12. The contact bodies 4 are made of copper and are to be inserted into the insulating housing 9. It is important that the pressure contact bodies 4 or the housing 9 need not have a groove or recess to accept the tubing sections 12.

After insertion of the pressure contact bodies 4 with their tubing sections 12 into the insulating housing 9, heating takes place. One can see from FIG. 1 that the relaxation of the tubing sections, caused by the heating, leads to a filling of the respective sealing slit and to a sealing surface connection on the inside 10 of the insulating housing 9, on the one hand and the circumferential edges of the pressure contact bodies 4, on the other hand. By heating the internal structure of, the plastic material, which had previously been cross-linked by electron irradiation the cross linking, is split, and an increase of material size results. Heating preferably takes place to temperatures between 393 to 433 K (120°–160° C.).

It is understood that several, preferably two, disc shaped semiconductor discs 1, can be inserted with a stacking technique with further metallic round bodies into the housing.

What is claimed as new and desired to be secured by Letters Patent of the United States is:

1. A method for the production of a sealed housing for a disc shaped semiconductor body having at least one pn-transition, said method comprising the steps of:
   pressure contacting opposing axial surfaces of said semi-conductor body with electrode elements and contact bodies to form a thermally and electrically sealing axial housing for said semiconductor body;
   positioning a stretched elastic seal ring on the radial periphery of each said contact body, said seal ring comprising tubing sections formed of a material treated by electron irradiation and radially expandable by heating;
   inserting said axial housing into a hollow radial housing whose inner diameter defines a gap with respect to said seal rings; and
   heating said seal rings, whereby said seal rings radially expand to close said gap and form a sealed housing.

2. The method of claim 1 wherein said step of positioning a stretched elastic seal comprises positioning a stretched elastic seal formed of synthetic caoutchouc.

* * * * *